United States Patent
Miyata et al.

(10) Patent No.: US 8,053,286 B2
(45) Date of Patent: Nov. 8, 2011

(54) METHOD OF FORMING SEMICONDUCTOR DEVICE INCLUDING TRENCH GATE STRUCTURE

(75) Inventors: Kyoko Miyata, Tokyo (JP); Fumiki Aiso, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 412 days.

(21) Appl. No.: 12/270,875

(22) Filed: Nov. 14, 2008

(65) Prior Publication Data

US 2009/0130823 A1    May 21, 2009

(30) Foreign Application Priority Data

Nov. 16, 2007  (JP) .................... 2007-297682

(51) Int. Cl.
 *H01L 21/335* (2006.01)
(52) U.S. Cl. ........ 438/142; 438/195; 438/196; 438/206; 438/207; 438/212; 438/259; 438/268; 438/294; 438/270
(58) Field of Classification Search ............ 438/142, 438/195, 196, 206, 207, 212, 259, 268, 294, 438/270
See application file for complete search history.

(56) References Cited

U.S. PATENT DOCUMENTS

| 2003/0087503 | A1* | 5/2003 | Sakaguchi et al. | 438/406 |
| 2007/0148884 | A1* | 6/2007 | Park et al. | 438/296 |
| 2007/0224763 | A1* | 9/2007 | Fujimoto et al. | 438/259 |
| 2009/0087550 | A1* | 4/2009 | Leusink et al. | 427/126.1 |

FOREIGN PATENT DOCUMENTS

| JP | 2000-114362 | 4/2000 |
| JP | 2004-140039 | 5/2004 |
| JP | 2006-108243 | 4/2006 |

* cited by examiner

*Primary Examiner* — N Drew Richards
*Assistant Examiner* — Jae Lee
(74) *Attorney, Agent, or Firm* — Young & Thompson

(57) ABSTRACT

A method of forming a semiconductor device is provided, which may include, but is not limited to, the following processes. Grooves may be formed in an insulating region and in a semiconductor region, while forming burrs near the boundary between the insulating region and the semiconductor region. Protection films may be selectively formed on inside walls of the grooves except on bottom walls of the grooves. A selective thermal process may be carried out in the presence of the protection films, thereby removing the burrs.

17 Claims, 4 Drawing Sheets

METHOD OF FORMING SEMICONDUCTOR DEVICE INCLUDING TRENCH GATE STRUCTURE

BACKGROUND OF THE INVENTION

1. Field of the Invention

The present invention generally relates to a method of forming a semiconductor device. More specifically, the present invention relates to a method of forming a semiconductor device including a trench gate structure.

Priority is claimed on Japanese Patent Application No. 2007-297682, filed Nov. 16, 2007, the content of which is incorporated herein by reference.

2. Description of the Related Art

Semiconductor devices such as DRAM (Dynamic Random Access Memory) may generally include transistors and capacitors. Shrinkage of a semiconductor device will shrink the dimensions of a transistor that is included in the semiconductor device. Shrinkage of the dimensions of the transistor may cause remarkable short channel effects. Shrinkage of memory cells would in general reduce the channel length of a transfer gate transistor that is included in every memory cell of the semiconductor device particularly in large capacity DRAMs. Reduction of the channel length of the transfer gate transistor would increase S-value of the transfer gate transistor. Increasing the S-value of the transfer gate transistor may deteriorate the retention and writing performance of the memory cell.

Trench gate transistors with three dimensional channel structures have been known for countermeasure to the short channel effects of the transistor and/or for improvement in refresh properties of the DRAM. The trench gate transistor has a channel which extends along the side walls of a trench groove that is formed in a semiconductor substrate, so as to ensure the adequate channel length thereof. The trench gate structure can suppress the short channel effects of the transistor and may improve the refresh properties. The trench gate structure will ensure longer channel length that may allow reducing channel dose, thereby allowing field relaxation at p-n junctions of source/drain regions. The field relaxation will improve the refresh properties.

Japanese Unexamined Patent Application, First Publication, No. 2006-108243 discloses a semiconductor manufacturing method for a trench transistor in which an ozone treatment process is carried out to form an oxide film before an anneal process is then carried out to cause reduction of the oxide film or remove the oxide film, prior to causing migration of silicon atoms.

Japanese Unexamined Patent Application, First Publication, No. 2004-140039 discloses a semiconductor manufacturing method for a trench transistor in which an anneal process is carried out in a reduction atmosphere, while trench upper corners are covered by masks of silicon nitride.

Japanese Unexamined Patent Application, First Publication, No. 2000-114362 discloses a semiconductor manufacturing method for a trench transistor in which the lower half of a trench is buried by a spin on glass and then the upper half of the trench is then buried by an oxide film.

SUMMARY

In one embodiment, a method of forming a semiconductor device is provided, which may include, but is not limited to, the following processes. Grooves may be formed in an insulating region and in a semiconductor region, while forming burrs near the boundary between the insulating region and the semiconductor region. Protection films may be selectively formed on inside walls of the grooves except on bottom walls of the grooves. A selective thermal process may be carried out in the presence of the protection films, thereby removing the burrs.

In another embodiment, a method of forming a semiconductor device is provided, which may include, but is not limited to, the following processes. Grooves may be formed in an insulating region and in a semiconductor region, while forming burrs near the boundary between the insulating region and the semiconductor region. Protection films are selectively formed on inside walls of the grooves except on bottom walls of the grooves. A selective hydrogen baking process may be carried out in the presence of the protection films, thereby removing the burrs and recovering damages that have been introduced into the semiconductor substrate when the grooves have been formed.

In still another embodiment, a method of forming a semiconductor device is provided, which may include, but is not limited to, the following processes. Grooves may be formed in an insulating region and in a semiconductor region. Protection films may be selectively formed on inside walls of the grooves except on bottom walls of the grooves. A process may be carried out to cause selective migration of semiconductor on the bottom walls of the grooves in the presence of the protection films.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 7A, 7B, 8A, 8B, 9A, 9B, 10A and 10B, in order to facilitate the understanding of the present invention.

Figure 7A:
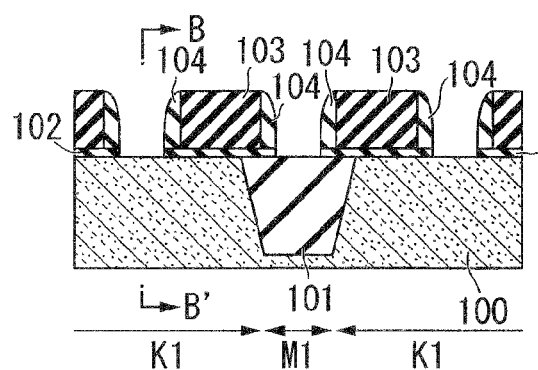
FIG. 7A is a fragmentary cross sectional elevation view illustrating a semiconductor device in one step involved in a method of forming the semiconductor device in accordance with a related art.
Figure 7B:
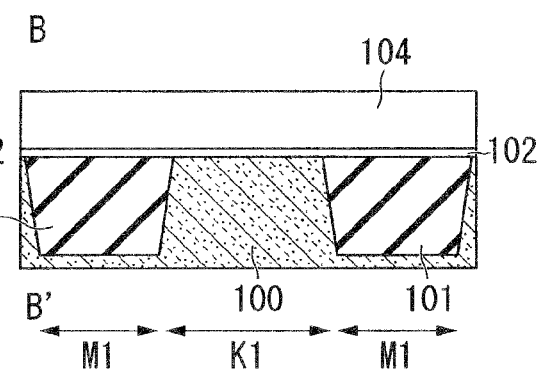
FIG. 7B is a fragmentary cross sectional elevation view illustrating the semiconductor device, taken along a B-B' line of FIG. 7A.

With reference to FIGS. 7A and 7B, a shallow trench isolation technique is used to form a trench groove in a semiconductor substrate 100 and then to bury an insulating film 101 such as a silicon oxide film in the trench groove, thereby defining a buried insulating region M1 and an active region K1.

A silicon oxide film 102 is formed over the semiconductor substrate 100 and the insulating film 101. The silicon oxide film 102 will perform as a pad insulating film. A silicon nitride film 103 is formed over the silicon oxide film 102, thereby forming a stack of the silicon oxide film 102 and the silicon nitride film 103. The stack of the silicon oxide film 102 and the silicon nitride film 103 is then patterned to form pad insulating patterns 103 and inversion mask patterns 103 for later-formation of gate electrodes. Side wall insulating films 104 are formed on the side walls of the inversion mask patterns 103.

Figure 8A:
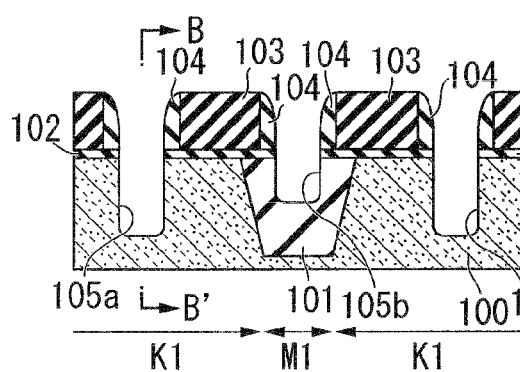
FIG. 8A is a fragmentary cross sectional elevation view illustrating the semiconductor device in another step subsequent to the step of FIG. 7A, involved in the method of forming the semiconductor device in accordance with the related art.
Figure 8B:
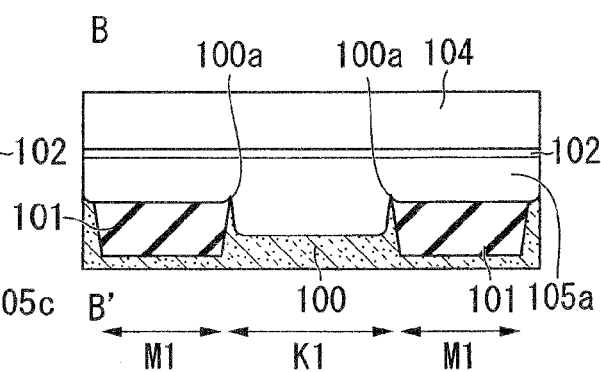
FIG. 8B is a fragmentary cross sectional elevation view illustrating the semiconductor device, taken along a B-B' line of FIG. 8A.

With reference to FIGS. 8A and 8B, an anisotropic etching process is carried out using the inversion mask patterns 103 of silicon nitride and the side wall insulating films 104 as a mask, thereby forming grooves 105a and 105c in the active region K1 of the semiconductor substrate 100 as well as forming a groove 105b in the buried insulating region M1 of the insulating film 101. There is a difference in etching rate between silicon and silicon oxide. This etching rate difference may form a sharpen projection or edge so called to as "burr" 100a at the boundary between the buried insulating region M1 of the and the active region K1 of the semiconductor substrate 100 as shown in FIG. 8B.

Figure 9A:
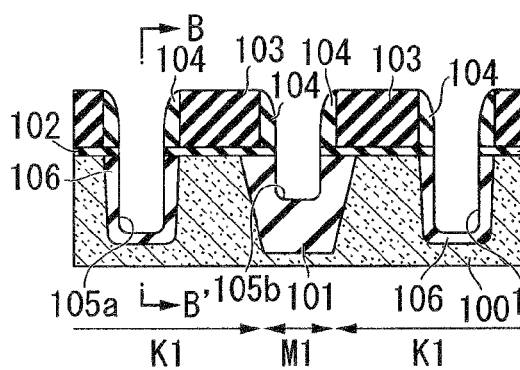
FIG. 9A is a fragmentary cross sectional elevation view illustrating the semiconductor device in still another step subsequent to the step of FIG. 8A, involved in the method of forming the semiconductor device in accordance with the related art.
Figure 9B:
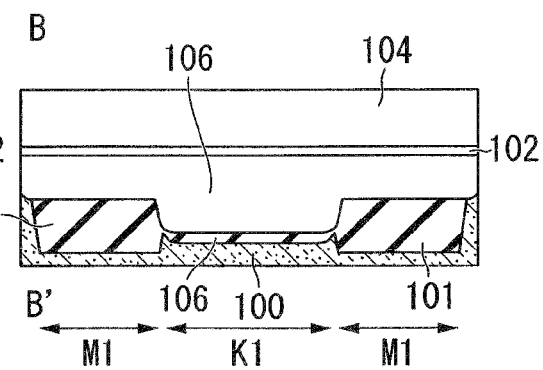
FIG. 9B is a fragmentary cross sectional elevation view illustrating the semiconductor device, taken along a B-B' line of FIG. 9A.

With reference to FIGS. 9A and 9B, a dummy oxide film 106 is formed in the inside walls of each of the grooves 105a, 105b, and 105c. The dummy oxide film 106 is then removed, thereby removing the damages from the inside walls of each of the grooves 105a, 105b, and 105c.

Figure 10A:
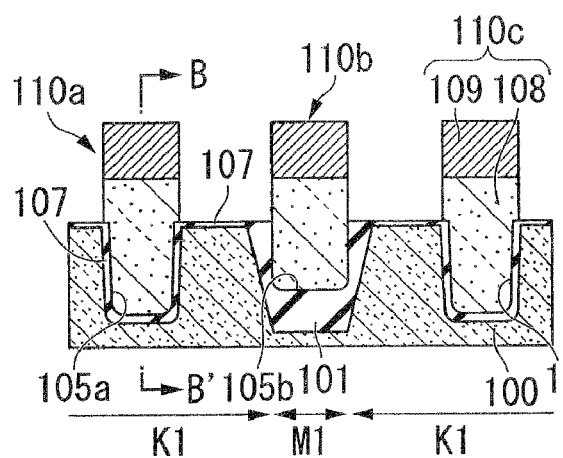
FIG. 10A is a fragmentary cross sectional elevation view illustrating the semiconductor device in yet another step subsequent to the step of FIG. 9A, involved in the method of forming the semiconductor device in accordance with the related art.
Figure 10B:
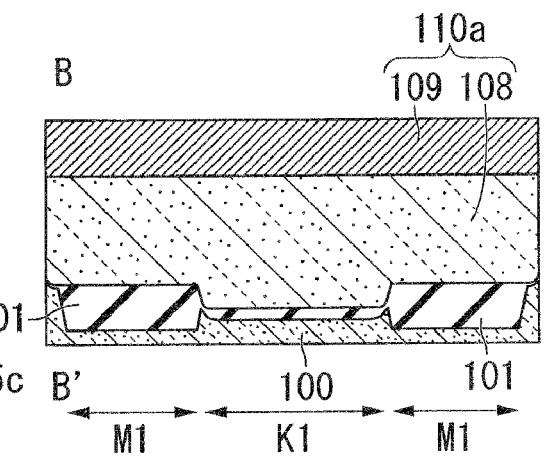
FIG. 10B is a fragmentary cross sectional elevation view illustrating the semiconductor device, taken along a B-B' line of FIG. 10A.

With reference to FIGS. 10A and 10B, a gate insulating film 107 is formed over the surface of the semiconductor substrate 100 and on the inside walls of each of the grooves 105a, 105b, and 105c. An impurity-doped polysilicon layer 108 is formed on the gate insulating film 107. The impurity-doped polysilicon layer 108 buries the grooves 105a, 105b, and 105e. The impurity-doped polysilicon layer 108 extends over the surface of the semiconductor substrate 100. A metal layer 109 is formed over the impurity-doped polysilicon layer 108. The metal layer 109 is made of tungsten or tungsten nitride. The stacked structure of the impurity-doped polysilicon layer 108 and the metal layer 109 are selectively etched, thereby forming gate electrodes 110a, 110b, and 110c.

The burr 100a remains after the gate electrodes 110a, 110b and 110c have been formed because the burr 100a is generally irremovable by dummy oxidation or gate oxidation.

The burr 100a will decrease the reliability of the gate insulating film 107. For example, the burr 100a will deteriorate the indexes of the gate insulating film 107, which indicate the time dependent dielectric breakdown A chemical etching process or a hydrogen baking process needs to be carried out to remove the burr 100a.

The chemical etching process or the hydrogen baking process is carried out, thereby removing other portions than the burr 100a and/or causing migration of silicon atoms in the semiconductor substrate. Removal of the other portions than the burr 100a and/or the migration of silicon atoms will cause deformation of each of the grooves 105a, 105b and 105c, for example, widening the grooves 105a, 105b and 105c.

Separately from the removal of the other portions than the burr 100a and/or the migration of silicon atoms, a set of the formation and subsequent removal of the dummy film 106 is carried out after the grooves 105a, 105b and 105c have been formed. This set of the formation and subsequent removal processes may increase the width of each of the grooves 105a, 105b and 105c, thereby causing misalignment of the gate pattern to the pattern of the grooves 105a, 105b, and 105c. The misalignment of the gate pattern to the pattern of the grooves 105a, 105b, and 105c makes it difficult to allow the gate pattern to completely cover the pattern of the grooves 105a, 105b and 105c.

The misalignment between the pattern of the grooves 105a, 105b and 105c and the gate pattern will result in that the gate pattern does not completely cover the pattern of the grooves 105a, 105b and 105c. In general, contacts are then formed over the gate patterns. A short circuit may be formed between the conductive material of the contacts and the polysilicon in the grooves 105a, 105b and 105c.

Further, the width of the groove 105b in the buried insulating region M1 is increased. The increase in the width of the groove 105b in the buried insulating region M1 decreases the distance between the polysilicon in the groove 105b and the semiconductor substrate 100. The decrease of the distance between the polysilicon in the groove 105b and the semiconductor substrate 100 increases parasitic capacitance between the polysilicon in the groove 105b and the semiconductor substrate 100. The increase of the parasitic capacitance will deteriorate switching performances of the transistor.

The insulating film 10 in the trench groove may in general include micro voids. Such micro voids may be present on the inside walls of each of the grooves 105a, 105b and 105c when the grooves 105a, 105b and 105e have been formed. The dummy oxide film 107 can be removed by a wet etching process using a hydrofluoric acid. The micro voids being present on the inside walls of each of the grooves 105a, 105b and 105c are enlarged in size by the wet etching process using the hydrofluoric acid. The process for forming the polysilicon film 108 in each of the grooves 105a, 105b and 105c may cause a short circuit between two adjacent gate electrodes through the shallow trench isolation.

It is preferable to remove the damages on the inside walls of each of the grooves 105a, 105b and 105c, while maintaining the shape and dimension of each of the grooves 105a, 105b and 105e.

The followings are related to the techniques for removing the damages but not burr. An ozone treatment process can be carried out to form an oxide film before an anneal process is then carried out to cause reduction of the oxide film or remove the oxide film, prior to causing migration of silicon atoms.

An anneal process can be carried out in a reduction atmosphere, while trench upper corners are covered by masks of silicon nitride.

A lower half of a trench can be buried by a spin on glass and then the upper half of the trench is then buried by an oxide film.

Those techniques are difficult to remove the burr from the boundary between the insulating region and the silicon region, even the damages could be removed from the inside wall of the groove.

It is more preferable to remove burr from the boundary between the insulating region and the silicon region in addition to removing the damages from the inside walls of the groove, while maintaining the shape and dimension of the groove.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

A method of forming a semiconductor device will be described with reference to FIGS. 1A, 1B, 2A, 2B, 3A, 3B, 4A, 4B, 5A, 5B, 6A, and 6B. The method of forming a semiconductor device may include, but is not limited to, a process for forming grooves in a substrate, a process for forming a gate insulating film and gate electrodes in the grooves; and a process for forming diffusion layers.

[Process for Forming Groove]

The process for forming the grooves in the substrate may further include, but is not limited to, a process for forming an isolation region, a process for forming a mask, a process for forming a groove pattern, a process for forming a protection film, a process for selectively removing the protection film, and a process for removing burr.

The process for forming an isolation region may further include, but is not limited to, a process for forming a buried insulating region in a semiconductor substrate, thereby forming an isolation region.

The process for forming a mask may further include, but is not limited to, a process for forming an inversion mask for groove pattern in the substrate.

The process for forming a groove pattern may further include, but is not limited to, a process for forming a pattern of grooves by using the inversion mask.

The process for forming a protection film may further include, but is not limited to, a process for forming the protection film on the inside walls of the grooves.

The process for selectively removing the protection film may further include, but is not limited to, a process for selectively removing the protection film from the bottoms of the grooves, while leaving the protection film on the side walls of the grooves. The process for selectively removing the protection film may be implemented by, but not limited to, a set of an anisotropic etching process and an isotropic etching process to be carried out subsequent to the anisotropic etching process.

The process for removing burr may further include, but is not limited to, a process for selectively applying hydrogen baking to the exposed surface of the semiconductor substrate at the bottom of each of the grooves, wherein the exposed surface of the semiconductor substrate is not covered by the protection film, thereby removing the burr or the sharpens of the burr.

(Process for Forming Isolation Region)

Figure 1A:
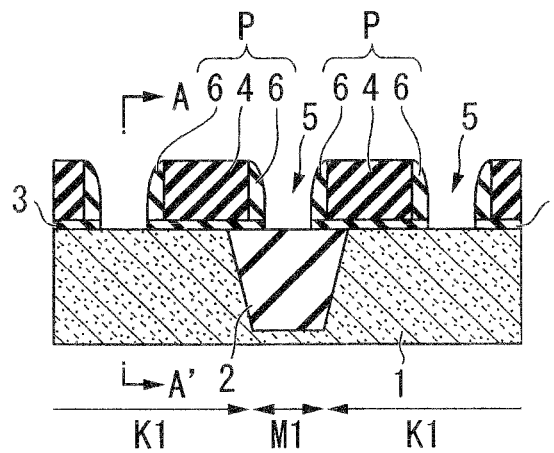
FIG. 1A is a fragmentary cross sectional elevation view illustrating a semiconductor device in one step involved in a method of forming the semiconductor device in accordance with a first preferred embodiment of the present invention.
Figure 1B:
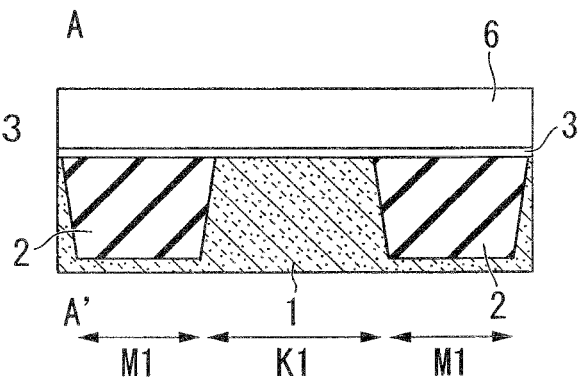
FIG. 1B is a fragmentary cross sectional elevation view illustrating the semiconductor device, taken along an A-A' line of FIG. 1A.

With reference to FIGS. 1A and 1B, a process for selectively forming a buried insulating region M1 in a semiconductor substrate 1 is carried out, thereby forming an isolation region M1 in the semiconductor substrate 1. The isolation region M1 defines active regions K1 of the semiconductor substrate 1. The process for selectively forming the buried insulating region M1 can be realized by shallow trench isolation (STI). In some cases, a selective etching process is carried out to selectively etch the semiconductor substrate 1, thereby forming an isolation groove in the semiconductor substrate 1. In some cases, the isolation groove may have a taper in the range of, but not limited to, 87 degrees to 89 degrees. A high density plasma oxide film 2 may be formed to bury up the isolation groove and to extend over the surface of the semiconductor substrate 1. A chemical mechanical polishing process is carried out to remove the high density plasma oxide film 2 from the surface of the semiconductor substrate 1, while leaving the high density plasma oxide film 2 in the isolation groove. As a result, the surface of the semiconductor substrate 1 is exposed. The formation of the isolation region M1 defines the active regions K1. In some cases, the active regions K1 may be in the form of islands.

(Process for Forming Mask)

A first insulating film 3 is formed over the surface of the semiconductor substrate 1 and over the insulating region M1. In some cases, the first insulating film 3 may be a pad oxide film that is formed by oxidation. In some cases, the thickness of the first insulating film 3 may be in the range of, but is not limited to, 10 nm to 20 nm. For example, the thickness of the first insulating film 3 may preferably be, but not limited to, 10 nm.

Well regions are formed in the semiconductor substrate 1. In some cases, the well regions may be, but not limited to, p-well regions. In some cases, the p-well regions can be formed by an ion-implantation process and a heat treatment for recovery of damages caused by the ion-implantation process. In some cases, the ion-implantation process may be carried out by implanting boron ions into the semiconductor substrate 1 so that boron ions penetrate the first insulating film 3. In some cases, the ion-implantation process may be carried out by, but not limited to, a set of the following three processes. The first ion-implantation process is carried out at acceleration energy of 250 keV and at a dose of 1E13 $cm^{-2}$. The second ion-implantation process is carried out at acceleration energy of 150 keV and at a dose of 5E12 $cm^{-2}$. The third ion-implantation process is carried out at acceleration energy of 80 keV and at a dose of 3E12 $cm^{-2}$. After the implantation of boron ions into the semiconductor substrate 1 have been completed, a treat treatment can be carried out to recover the damages that have been caused by the implantation of boron ions. In some cases, the heat treatment can be carried out, but not limited to, at 1000° C. for one minute.

Further, an additional ion-implantation process is carried out to introduce an impurity into the upper region of the well region, thereby forming a channel dope layer in the upper region of the well region. When the well region is the p-well region, the additional ion-implantation process may be carried out by introducing boron ions through the first insulating film 3 into the upper region of the semiconductor substrate 1. In some cases, the additional ion-implantation process for introducing boron ions can be carried out at acceleration energy of 30 keV and at a dose of 2E12 $cm^{-2}$.

A second insulating film 4 may be formed over the first insulating film 3. In some cases, the second insulating film 4 may be made of, but not limited to, silicon nitride. In some cases, the second insulating film 4 may have a thickness in the range of 100 nm to 200 nm, for example, 120 nm. In some cases, the second insulating film 4 may be formed by a chemical vapor deposition process.

The stack of the first and second insulating films 3 and 4 is selectively removed to form openings 5 therein. The selective removal process may be carried out by a lithography process and a dry etching process.

Side wall films 6 are formed on side walls of the stack of the first and second insulating films 3 and 4, thereby reducing the dimension of the opening 5. The upper portions of the side wall films 6 may be etched back, for example, but not limited to, 20 nm, thereby forming a mask pattern P over the semiconductor substrate 1. The mask pattern P can be used for forming gate trench in the semiconductor substrate 1. The mask pattern P has the openings 5 which are positioned in the isolation region M1 and the active regions K1. The mask pattern P is constituted by the second insulating film 4 and the side wall films 6.

(Process for Forming Groove Pattern)

Figure 2A:
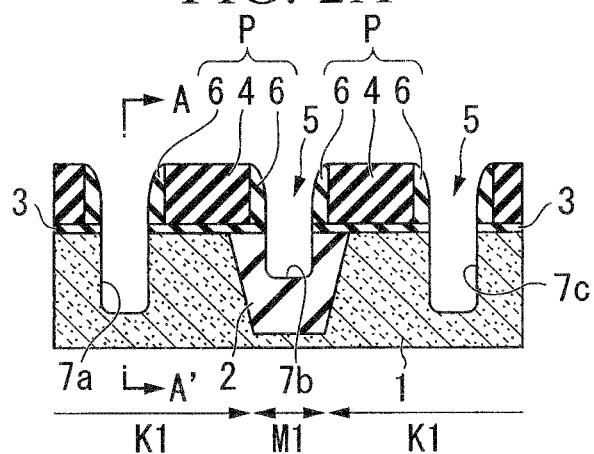
FIG. 2A is a fragmentary cross sectional elevation view illustrating the semiconductor device in another step subsequent to the step of FIG. 1A, involved in the method of forming the semiconductor device in accordance with the first preferred embodiment of the present invention.
Figure 2B:
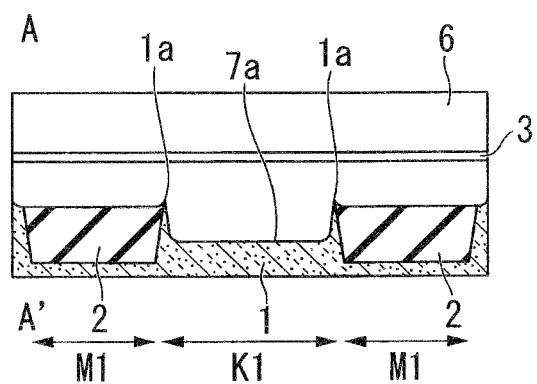
FIG. 2B is a fragmentary cross sectional elevation view illustrating the semiconductor device, taken along an A-A' line of FIG. 2A.

With reference to FIGS. 2A and 2B, the semiconductor substrate 1 is selectively removed by using the mask pattern P, thereby forming a groove pattern in the semiconductor substrate 1. When the semiconductor substrate 1 is a silicon substrate, a silicon etcher can be used to selectively etch the silicon substrate 1. It may be preferable to carry out the etching process for etching the semiconductor substrate under such conditions as vertically to the surface of the semiconductor substrate 1 and as keeping the selectivity to the mask pattern P and the isolation region M1 as possible. In some cases, the etching depth in the semiconductor substrate 1 may be, but is not limited to, about 150 nm, while the etching depth in the isolation region M1 may be, but is not limited to, in the range of about 50 nm to about 70 nm. When the second insulating films 4 of the mask pattern P are arranged at a constant pitch of 60 nm, grooves 7a, 7b and 7c having a width of about 30 nm can be formed. The grooves 7a and 7c with the depth of about 150 nm are formed in the semiconductor substrate 1. The groove 7b in the range of about 50 nm to about 70 nm is formed in the isolation region M1.

The above etching process not only forms the grooves 7a, 7b, and 7c but also forms sharpen projections or edges so called to as "burrs" 1a, 1a near the boundaries between the active regions K1 and the insulating region M1 as shown in FIG. 2B. The burrs 1a, 1a may be residual. The burrs 1a, 1a may be regarded as non-etched semiconductor portions or silicon portions.

(Process for Forming Protection Film)

Figure 3A:
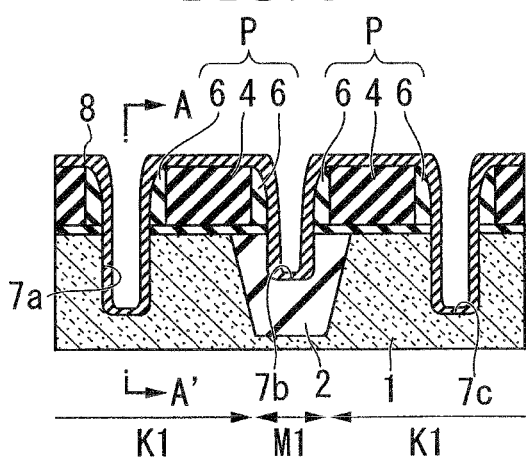
FIG. 3A is a fragmentary cross sectional elevation view illustrating the semiconductor device in still another step subsequent to the step of FIG. 2A, involved in the method of forming the semiconductor device in accordance with the first preferred embodiment of the present invention.
Figure 3B:
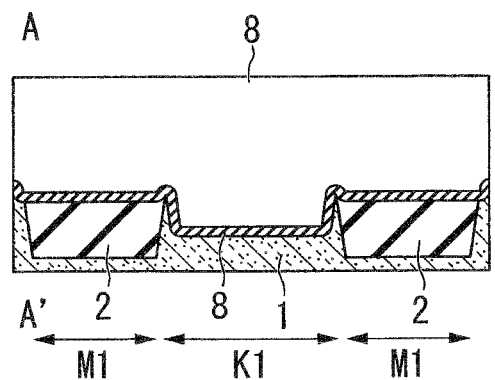
FIG. 3B is a fragmentary cross sectional elevation view illustrating the semiconductor device, taken along an A-A' line of FIG. 3A.

With reference to FIGS. 3A and 3B, after the groove pattern of the grooves 7a, 7b, and 7c has been formed, a protection film 8 can be formed which covers the mask pattern P and the groove pattern of the grooves 7a, 7b, and 7c entirely. Namely, the protection film 8 can be formed which extends along the upper and side faces of the mask pattern P and also along the side and bottom walls of the grooves 7a, 7b, and 7c as shown in FIG. 3A.

In some cases, the protection film 8 can be realized by, but not limited to, a high temperature oxide film that is formed by a low pressure chemical vapor deposition process. In a typical case, the high temperature oxide film 8 can be formed by using dichlorosilane ($SiH_2Cl_2$) and dinitrogen monoxide ($N_2O$) so as to grow the high temperature oxide film 8 at the temperature of 780° C. under the pressure of about 90 Pa for 60 minutes. The high temperature oxide film 8 may have a thickness of about 15 nm. In general, the high temperature oxide film has good step-coverage and high film-density, which are suitable as the protection film 8.

The high temperature oxide film 8 is formed as the protection film 8, while any small voids in the high density plasma oxide film 2 can be filled up with high temperature oxide, thereby preventing formation of any short circuit when a gate conductive film will be formed in the later process.

(Process for Selectively Removing the Protection Film)

Figure 4A:
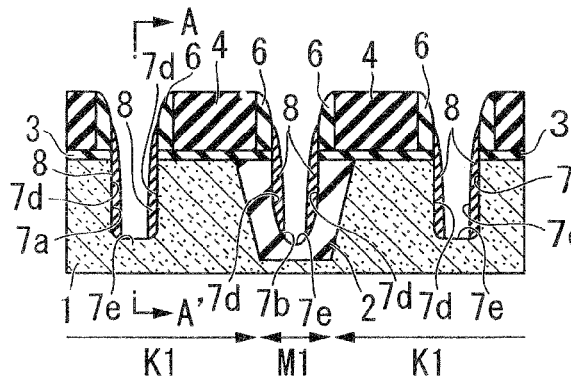
FIG. 4A is a fragmentary cross sectional elevation view illustrating the semiconductor device in yet another step subsequent to the step of FIG. 3A, involved in the method of forming the semiconductor device in accordance with the first preferred embodiment of the present invention.
Figure 4B:
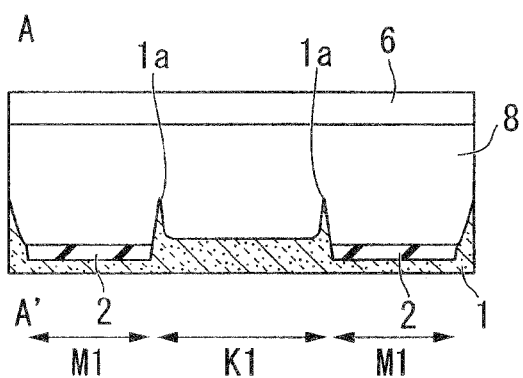
FIG. 4B is a fragmentary cross sectional elevation view illustrating the semiconductor device, taken along an A-A' line of FIG. 4A.
Figure 5A:
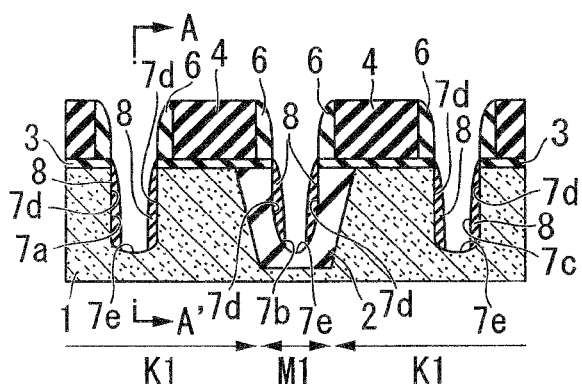
FIG. 5A is a fragmentary cross sectional elevation view illustrating the semiconductor device in yet another step subsequent to the step of FIG. 4A, involved in the method of forming the semiconductor device in accordance with the first preferred embodiment of the present invention.
Figure 5B:
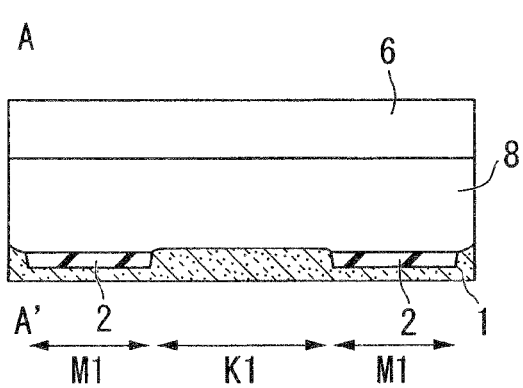
FIG. 5B is a fragmentary cross sectional elevation view illustrating the semiconductor device, taken along an A-A' line of FIG. 5A.
Figure 6A:
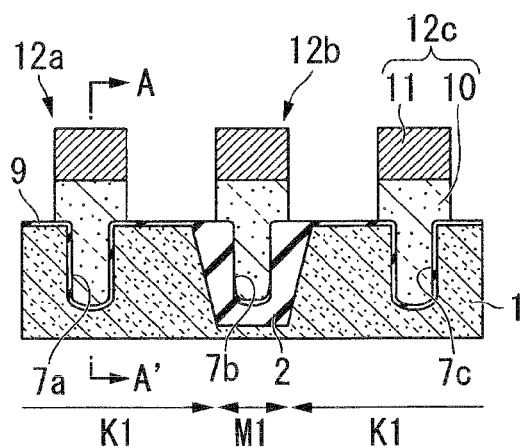
FIG. 6A is a fragmentary cross sectional elevation view illustrating the semiconductor device in further another step subsequent to the step of FIG. 5A, involved in the method of forming the semiconductor device in accordance with the first preferred embodiment of the present invention.
Figure 6B:
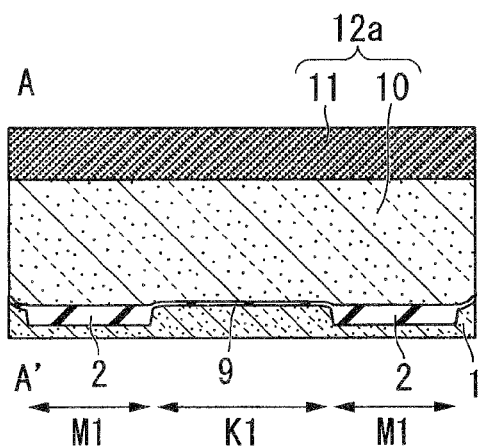
FIG. 6B is a fragmentary cross sectional elevation view illustrating the semiconductor device, taken along an A-A' line of FIG. 6A.

With reference to FIGS. 4A and 4B, the protection film 8 may be selectively removed from the upper surfaces of the mask pattern P and from the side faces of the upper portion of the mask pattern P as well as from the bottoms 7e of the grooves 7a, 7b, and 7c, while the protection film 8 resides on the side walls of the grooves 7a, 7b, and 7c as well as on the side faces of the lower portion of the mask pattern P. When the protection film 8 is the high temperature oxide film 8, the selective removal of the protection film 8 can be carried out by an etch-back process suing an oxide film etcher. The etch-back process can be carried out under such conditions as showing strong anisotropy, namely etching the protection film 8 in the vertical direction. In a typical case, the protection film 8 can be etched back by about 50 nm in the direction vertical to the surface of the semiconductor substrate 1, thereby reducing the thickness of the protection film 8. The thickness-reduced protection film 8 extending along the side walls 7d of the grooves 7a, 7b, and 7c has the thickness of about 8 nm. The protection film 8 on the bottom walls 7e of the grooves 7a, 7b, and 7c has the thickness in the range of about 3 nm to 4 nm. The protection film 8 on the bottom walls 7e of the grooves 7a, 7b, and 7c is etched back and also side-etched. The side etching of the protection film 8 is caused due to the tapered angle of the shallow trench isolation. The side etching of the protection film 8 at the bottoms 7e of the grooves 7a, 7b, and 7c in addition to the etch-back causes that the thickness-reduced protection film 8 on the bottom walls 7e of the grooves 7a, 7b, and 7c is thinner than the thickness-reduced protection film 8 along the side walls 7d of the grooves 7a, 7b, and 7c.

An isotropic etching process can be carried out following to the etch-back process. The isotropic etching process can be carried out to etch the thickness-reduced protection film 8 so that the thickness-reduced protection film 8 on the bottom walls 7e of the grooves 7a, 7b, and 7c is completely removed, while the thickness-reduced protection film 8 along the side walls 7d of the grooves 7a, 7b, and 7c resides but reduces in thickness. Namely, the isotropic etching process can be carried out to remove the thickness-reduced protection film 8 from the bottom walls 7e of the grooves 7a, 7b, and 7c, while leaving the protection film 8 on the side walls 7d of the grooves 7a, 7b, and 7c.

In a typical case, the isotropic etching process for removing the protection film 8 from the bottom walls 7e of the grooves 7a, 7b, and 7c, while leaving the protection film 8 on the side walls 7d of the grooves 7a, 7b, and 7c can be realized by a chemical etching process. The chemical etching process can be carried out under conditions as follows. A fluoro-anhydride gas and an ammonium gas are respectively introduced at 20 sccm and 20 sccm into a low pressure chamber of 20 mTorr that contains the substrate 1 at a temperature of about 35° C. so that the substrate 1 is subjected to those gases for about 60 seconds. Then, the substrate 1 is subjected to the heat treatment at about 180° C. in an inert gas atmosphere under the pressure of 650 mTorr.

The above-described chemical etching process is that an ammonium silicofluoride film is formed over the surface of the silicon oxide film and then a heat treatment is carried out to cause elimination, thereby etching the silicon oxide film. The chemical etching process can etch the silicon oxide film uniformly and isotropically, but independently from the quality of the silicon oxide film. The chemical etching process can be uniform over the protection film 8 and the isolation region M1. In some cases, the chemical etching process can etch the protection film 8 and the isolation region M1 uniformly and isotropically by about 5 nm. Thus, the chemical etching process can etch the protection film 8 at the bottoms 7e of the grooves 7a, 7b, and 7c, while further etching the protection film 8 along the side walls 7d of the grooves 7a, 7b, and 7c. Before the chemical etching process is carried out, the protection film 8 at the bottoms 7e of the grooves 7a, 7b, and 7c is thinner than the protection film 8 along the side walls 7d of the grooves 7a, 7b, and 7c. Thus, the chemical etching process can etch completely the protection film 8 at the bottoms 7e of the grooves 7a, 7b, and 7c, while etching partially the protection film 8 along the side walls 7d of the grooves 7a, 7b, and 7c. Namely, the chemical etching process can remove the protection film 8 from the bottoms 7e of the grooves 7a, 7b, and 7c, while leaving the protection film 8 along the side walls 7d of the grooves 7a, 7b, and 7e.

In another typical case, the isotropic etching process for removing the protection film 8 from the bottom walls 7e of the grooves 7a, 7b, and 7c, while leaving the protection film 8 on the side walls 7d of the grooves 7a, 7b, and 7e can be realized by a wet etching process. When the protection film 8 is a high temperature oxide film, the ratio of the etching rate of the high temperature oxide film as the protection film 8 to the thermal oxide film is at least about 4. Namely, the etching rate of the high temperature oxide film is higher than the etching rate of the thermal oxide film. This means that it is not easy to precisely control the etching amount of the high temperature oxide film as the protection film 8.

(Process for Removing Burr)

The sharpen projections or edges so called to as "burrs" 1a, 1a near the boundaries between the active regions K1 and the insulating region M1 are removed, while the damages of the inside walls of the grooves 7a, 7b, and 7c are also recovered.

A selective thermal process may be carried out using the protection film 8, wherein the selective thermal process will not only remove burrs 1a, 1a partially or entirely but also recover the damages of the inside walls of the grooves 7a, 7b, and 7c of the semiconductor substrate 1 perfectly or imperfectly. Generally, the selective thermal process using the protection film 8 may not cause any substantive deformation of the buried insulating region M. In some cases, the thermal process can be realized by, but not limited to, a hydrogen baking process. In some cases, the hydrogen baking process may be carried out under, but not limited to, at a temperature in the range of 800° C. to 900° C., in a hydrogen ($H_2$) atmosphere under the pressure of about 15 Torr, and for about 3 minutes. The process can be carried out to cause selective migration of silicon crystal on the exposed surface of the semiconductor substrate 1, namely on the inside walls of the grooves 7a, 7b, and 7c of the semiconductor substrate 1. The hydrogen baking process will cause the migration of silicon crystal. The selective migration of silicon crystal that is caused by the hydrogen baking process is like a phenomenon of melting of the exposed surface of the semiconductor substrate 1, namely on the inside walls of the grooves 7a, 7b, and 7c of the semiconductor substrate 1. The selective migration of semiconductor crystal or silicon crystal on the exposed surface of the semiconductor substrate 1, namely on the inside walls of the grooves 7a, 7b, and 7c of the semiconductor substrate 1 will remove burrs 1a, 1a. The thermal process will cause rearrangement of semiconductor crystal or silicon crystal on the exposed surface of the semiconductor substrate 1, namely on the inside walls of the grooves 7a, 7b, and 7c of the semiconductor substrate 1. The hydrogen baking process will cause the rearrangement of semiconductor crystal or silicon crystal. The rearrangement of semiconductor crystal or silicon crystal will recover the damages that were introduced in the ion-etching process for etching semiconductor or silicon. The thermal process will cause substantially no deformation of the buried insulating region M.

Preferably, the selective thermal process can be carried out using the protection film 8, wherein the selective thermal process will cause not only removal of the burrs 1a, 1a partially or entirely but also recovery of the damages perfectly or imperfectly, with substantially no deformation of the buried insulating region M. The hydrogen baking process may be one of the available processes for realizing the thermal process.

The selective thermal process can be carried out to cause selective migration of the semiconductor crystal or silicon crystal at the bottoms of the grooves 7a, 7b and 7c thereby removing the burrs as well as to cause recovery of the damages, while the protection films 8 covering the side walls of the grooves 7a, 7b and 7c prevent any migration of the semiconductor crystal or silicon crystal on the side walls of the grooves 7a, 7b and 7c, thereby preventing any substantive deformation of the grooves 7a, 7b, and 7c. The selective thermal process can prevent any substantive change in depth of the grooves 7a, 7b and 7c. The selective thermal process can prevent any substantive increase in width of the grooves 7a, 7b and 7c. In a typical case, the selective thermal process can be realized by a hydrogen baking process using the protection film 8 which covers the side walls of the grooves 7a, 7b and 7c but does not cover the bottoms of the grooves 7a, 7b and 7c.

The selective thermal process such as the hydrogen baking process makes it unnecessary to form the dummy oxide film and remove the dummy oxide film. No processes for forming any dummy oxide film and removing the dummy oxide film will prevent the grooves to be widened or to be deformed.

The gate insulating film of the trench gate transistor may be as high in reliability as the gate insulating film of the planer transistor. At worst, the gate insulating film of the trench gate transistor may be lower by only one digit as the gate insulating film of the planer transistor.

[Process for Forming Gate Electrodes]

A process can be carried out, which removes the mask pattern P of the second insulating film 4 and the side wall films 6. A further process can be carried out, which removes the first insulating film 3 and the residual protection film 8. The processes for removing the mask pattern P of the second insulating film 4 and the side wall films 6 can be realized by any available techniques. The further processes for removing the first insulating film 3 and the residual protection film 8 can be realized by any available techniques. In some cases, a phosphoric acid may be available.

After the mask pattern P, the first insulating film 3 and the residual protection film 8 have been removed, the surface of the semiconductor substrate 1 or the silicon substrate 1 is exposed. Namely, the surface of the active region K1 is exposed. A gate insulating film 9 may be formed on the semiconductor surface or silicon surface of the active region K1, including the inner walls of the grooves 7a and 7c. The gate insulating film 9 may thus extend along the semiconductor surface or silicon surface of the active region K1, including the inner walls of the grooves 7a and 7c. The gate insulating film 9 may typically be realized by an oxide film or a silicon oxide film. When the gate insulating film 9 is an oxide film or a silicon oxide film, the gate insulating film 9 can be formed by carrying out an oxidation process to the semiconductor surface or silicon surface of the active region K1, including the inner walls of the grooves 7a and 7c. In some cases, an In-Situ Stream Generation method is available as the oxidation process to form the gate oxide film 9. In some cases, the gate insulating film 9 may have a thickness of, but not limited to, about 6 nm.

After the gate insulating film 9 has been formed, a first conductive film 10 for gate electrodes may be formed on the gate insulating film 9. The first conductive film 10 buries up the grooves 7a, 7b and 7c and also is positioned over the upper surface of the semiconductor substrate 1. In some cases, the first conductive film 10 may be realized by, but not limited to, an impurity-doped polysilicon film such as a phosphorous-doped polysilicon film having a thickness of about 100 nm. The impurity-doped polysilicon film 10 can be formed by, but not limited to, a low pressure chemical vapor deposition process. A second conductive film 11 may be formed over the first conductive film 10, thereby forming a stack of the first and second conductive films 11 and 12. The second conductive film 11 may be realized by, but not limited to, a metal layer such as a tungsten layer or a tungsten nitride layer. The tungsten layer 11 or the tungsten nitride layer 11 may be formed by, but not limited to, a sputtering process. In some cases, the second conductive film 11 may have a thickness of, but not limited to, about 60 nm.

The stack of the first and second conductive films 10 and 11 may be selectively removed, thereby forming gate electrodes 12a, 12b and 12c. The selective removal process can be carried out by a lithography process and an etching process. The etching process may be carried out so that the etching process will stop at the gate insulating film 9. The etching process may be carried out to etch the stack of the first and second conductive films 10 and 11, without etching the gate insulating film 9.

[Process for Forming Diffusion Layer]

Diffusion regions may be selectively formed in the semiconductor substrate 1 in the usual way, for example, a selective ion-implantation process for selectively introducing impurity ions into the semiconductor substrate 1. The diffusion regions may have lightly doped drain structure.

The diffusion regions may be formed by, but not limited to, the followings. In some cases, phosphorus ions may be introduced into the semiconductor substrate 1, thereby forming n-diffusion regions in the semiconductor substrate 1. In other cases, arsenic ions may be introduced into the semiconductor substrate 1, thereby forming n-diffusion regions in the semiconductor substrate 1. Phosphorus ions may be implanted at acceleration energy of 50 keV and a dose of $1E14$ $cm^{-2}$. Arsenic ions may be implanted at acceleration energy of 20 keV and a dose of $1E15$ $cm^{-2}$. Activation of the implanted ions can be caused by a heat treatment, thereby forming source and drain regions in the semiconductor substrate 1. The heat treatment for activation can be carried out at 1000° C. for about 10 seconds.

An inter-layer insulator is formed over the gate electrodes 12a, 12b, and 12c and over the semiconductor substrate 1. Contact holes are formed in the inter-layer insulator, so that the contact holes are positioned over the source and drain regions. Contact plugs are formed in the contact holes, so that the contact plugs contact with the source and drain regions. Interconnections or wirings are formed over the inter-layer insulator, so that the interconnections or wirings are connected through the contact plugs to the source and drain regions, thereby forming a transistor with trench gate structure.

In some cases, the transistor can be a transfer gate transistor of a memory cell in a dynamic random access memory (DRAM). Cell capacitors and interconnections are formed over the transistors, to form memory cells. Plural inter-layer insulators are formed over the transistors. Contact holes are formed in the plural inter-layer insulators. Contact plugs are formed in the contact holes. The contact plugs may include, but are not limited to, bit line contact, and storage node contacts. Bit lines are then formed over the inter-layer insulators. Cell capacitors are formed over the inter-layer insulators. Further interconnections are formed over the inter-layer insulators. Asymmetrical cell transistors with trench gates are used as the transfer gate transistors of the memory cells.

As described above, the selective thermal process will cause not only removal of the burrs partially or entirely but also recovery of the damages perfectly or imperfectly, with substantially no deformation of the buried insulating region. The hydrogen baking process may be one of the available processes for realizing the thermal process.

The selective thermal process can be carried out to cause selective migration of the semiconductor crystal or silicon crystal at the bottoms of the grooves, thereby removing the burrs as well as to cause recovery of the damages, while the protection films 8 covering the side walls of the grooves prevent any migration of the semiconductor crystal or silicon crystal on the side walls of the grooves, thereby preventing any substantive deformation of the grooves. The selective thermal process can prevent any substantive change in depth of the grooves. The selective thermal process can prevent any substantive increase in width of the grooves. In a typical case, the selective thermal process can be realized by a hydrogen baking process using the protection film which covers the side walls of the grooves but does not cover the bottoms of the grooves.

The selective thermal process such as the hydrogen baking process makes it unnecessary to form the dummy oxide film and remove the dummy oxide film. No processes for forming any dummy oxide film and removing the dummy oxide film will prevent the grooves to be widened or to be deformed.

The above described series of processes can be applicable to the semiconductor device having the trench gate transistor.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, comprising:
    forming grooves in an insulating region and in a semiconductor region, with forming burrs near the boundary between the insulating region and the semiconductor region;
    selectively forming protection films on inside walls of the grooves except on bottom walls of the grooves; and
    carrying out a selective thermal process in the presence of the protection films, thereby removing the burrs,
    wherein selectively forming the protection films comprises:
        forming the protection film on the side and bottom walls of the grooves;
        carrying out an anisotropic etching process for etching the protection film, so that the protection film on the side walls of the groove is thicker than the protection film at the bottoms of the groove; and
        carrying out an isotropic etching process for etching the protection film, so that the protection film is removed from the bottoms of the grooves, while the protection film resides on the side walls of the grooves.

2. The method according to claim 1, wherein carrying out the selective thermal process comprises carrying out a hydrogen baking process.

3. The method according to claim 1, wherein carrying out the selective thermal process is carried out to cause selective migration of semiconductor on the bottom walls of the grooves.

4. The method according to claim 1, wherein the selective thermal process is carried out to recover damages that have been introduced into the semiconductor substrate when the grooves have been formed.

5. The method according to claim 1, wherein the selective thermal process is carried out to avoid any substantive deformation of the grooves.

6. The method according to claim 1, wherein the isotropic etching process is a chemical etching process.

7. The method according to claim 1, wherein forming the protection film comprises: a low pressure chemical vapor deposition process for forming a high temperature oxide film.

8. A method of forming a semiconductor device, comprising:
    forming grooves in an insulating region and in a semiconductor region, with forming burrs near the boundary between the insulating region and the semiconductor region;
    selectively forming protection films on inside walls of the grooves except on bottom walls of the grooves; and
    carrying out a selective hydrogen baking process in the presence of the protection films, thereby removing the burrs and recovering damages that have been introduced into the semiconductor substrate when the grooves have been formed,
    wherein selectively forming the protection films comprises:
        forming the protection film on the side and bottom walls of the grooves;
        carrying out an anisotropic etching process for etching the protection film, so that the protection film on the side walls of the groove is thicker than the protection film at the bottoms of the groove; and
        carrying out an isotropic etching process for etching the protection film, so that the protection film is removed from the bottoms of the grooves, while the protection film resides on the side walls of the grooves.

9. The method according to claim 8, wherein carrying out the selective thermal process is carried out to cause selective migration of semiconductor on the bottom walls of the grooves.

10. The method according to claim 8, wherein the selective thermal process is carried out to avoid any substantive deformation of the grooves.

11. The method according to claim 8, wherein the isotropic etching process is a chemical etching process.

12. The method according to claim 8, wherein forming the protection film comprises: a low pressure chemical vapor deposition process for forming a high temperature oxide film.

13. A method of forming a semiconductor device, comprising:
    forming grooves in an insulating region and in a semiconductor region;
    selectively forming protection films on inside walls of the grooves except on bottom walls of the grooves; and
    causing selective migration of semiconductor on the bottom walls of the grooves in the presence of the protection films,
    wherein selectively forming the protection films comprises:
        forming the protection film on the side and bottom walls of the grooves;
        carrying out an anisotropic etching process for etching the protection film, so that the protection film on the side walls of the groove is thicker than the protection film at the bottoms of the groove; and
        carrying out an isotropic etching process for etching the protection film, so that the protection film is removed from the bottoms of the grooves, while the protection film resides on the side walls of the grooves.

14. The method according to claim 13, wherein the grooves are formed, while burrs are formed near the boundary between the insulating region and the semiconductor region, and wherein the burrs are removed by the selective migration.

15. The method according to claim 13, wherein carrying out the selective thermal process comprises carrying out a hydrogen baking process.

16. The method according to claim 13, wherein the isotropic etching process is a chemical etching process.

17. The method according to claim 13, wherein forming the protection film comprises: a low pressure chemical vapor deposition process for forming a high temperature oxide film.

* * * * *